United States Patent
Matsuda

(10) Patent No.: US 7,564,093 B2
(45) Date of Patent: Jul. 21, 2009

(54) SEMICONDUCTOR DEVICE

(75) Inventor: Satoshi Matsuda, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 11/519,050

(22) Filed: Sep. 12, 2006

(65) Prior Publication Data
US 2007/0069267 A1    Mar. 29, 2007

(30) Foreign Application Priority Data
Sep. 12, 2005    (JP)    ............... 2005-263798

(51) Int. Cl.
*H01L 29/788*    (2006.01)
*H01L 21/8238*   (2006.01)
(52) U.S. Cl. ................. 257/315; 257/314; 257/304; 257/305; 257/E21.661; 438/211; 438/258; 438/593
(58) Field of Classification Search .......... 257/E21.661, 257/E27.098–101, 311–321; 438/257–258, 438/593–594, 211
See application file for complete search history.

(56) References Cited

U.S. PATENT DOCUMENTS

| 5,677,866 A | 10/1997 | Kinoshita |
| 5,937,288 A * | 8/1999 | Alsmeier et al. ............ 438/221 |
| 2006/0163635 A1* | 7/2006 | Aitken et al. ................ 257/300 |

FOREIGN PATENT DOCUMENTS

JP    7-183400 A    7/1995

* cited by examiner

*Primary Examiner*—Dung A. Le
(74) *Attorney, Agent, or Firm*—Foley & Lardner LLP

(57) ABSTRACT

A semiconductor device comprises static random access memory (SRAM) cells formed in a semiconductor substrate, first deep trenches isolating each boundary of an n-well and a p-well of the SRAM cells, second deep trenches isolating the SRAM cells into each unit bit cell, and at least one or more contacts taking substance voltage potentials in regions isolated by the first and second deep trenches. Then, the device becomes possible to improve a soft error resistance without increasing the device in size.

5 Claims, 4 Drawing Sheets

US 7,564,093 B2

SEMICONDUCTOR DEVICE

CROSS-REFERENCE TO RELATED APPLICATIONS

This application is based upon and claims the benefit of priority from the prior Japanese Patent Application No. 2005-263798 filed on Sep. 12, 2005, the entire contents of which are incorporated herein by reference.

BACKGROUND OF THE INVENTION

1. Field of the Invention

The present invention relates to a semiconductor device and a manufacturing method thereof with a static random access memory (SRAM) mounted thereon.

2. Description of the Related Art

In recent years, influence of cosmic rays such as a rays and neutron rays on a semiconductor device has been highlighted as miniaturization of the semiconductor device. This includes the fact that an occurrence of a soft error phenomenon to be a false operation of a device caused by generating pairs of electrons and holes in a semiconductor substrate and becoming a current to flow into an electrode when the cosmic rays are incident to the semiconductor substrate with an element formed thereon.

For instance, in a semiconductor element shown in FIG. 1, when an a ray 120 with high energy is incident to a semiconductor substrate 101, the semiconductor element generates pairs of electrons and holes 121 in the semiconductor substrate along with an incident locus. The generated electric charges flow out as a current depending on an electric potential distribution in the semiconductor substrate. Here, a diffusion layer n+ isolated by element isolating dielectric films 108 having been biased to a power supply voltage Vdd and a P-well region 102 of a substrate part having been biased to a ground voltage GND, the generated electrons and holes flow into the diffusion layer n+ 105 and the P-well region 102, respectively.

In a dynamic random access memory (DRAM) one memory cell is comprised of one MOSFET and one capacitor storing data as electric charges therein; however the DRAM poses a problem such that an electric charge quantity of the capacitor is easily varied due to the electric charges generated from the cosmic rays in the manner described above. Therefore, a method has been used, in which the structure of the DRAM is varied from a planer capacitor into a deep trench capacitor forming an electrode on the inner wall of a deep trench formed in a substrate so as to maintain a capacity of the capacitor as well as improve a soft error resistance.

In contrast, in the SRAM, a bit cell is comprised of a P-channel MOSFET and an N-channel MOSFET combining alternatively. For example, as a cross-sectional view and an top view are shown in FIG. 2 and FIG. 3, respectively, in an N-well 102a and a P-well 102b formed in the p-semiconductor substrate 101, a P-channel MOSFET 107a and an N-channel MOSFET 107b are comprised of gate electrodes 104a and 104b, respectively, and high-density diffusion layers 105 and low-density diffusion layers 106' formed so as to sandwich the directly under part of the gate electrodes 104a and 104b, respectively. These P-channel and N-channel MOSFETs 107a and 107b are isolated by the element isolating dielectric films 108 and connected to metal wirings 110 such as word lines, bit lines and Vdds, respectively.

As a circuit diagram of an SRAM cell structured as mentioned above and shown in FIG. 4, the SRAM cell is biased even in storing data and the data is stored owing to balance of a voltage applied to a MOSFET circuit, so that the influence caused by the cosmic rays has not posed a large problem. As the semiconductor device becomes minute, however, the inner capacity of the SRAM, etc., becomes small to about 1 fF and a breakdown of stored data due to a soft error becomes no longer allowed to be neglected.

Up to this day, to improve the soft error resistance, a variety of methods have been disclosed in, for instance, JP 7-183400. However, a plurality of electric charges generated from the cosmic rays incident into a substrate; disturb data-storing currents of a plurality of bit cells. So that even with a data correction conducted in a circuit, the method has posed a problem that it is hard to conduct accurate data-storing.

SUMMARY OF THE INVENTION

According to an embodiment of the present invention, there is provided a semiconductor device, comprising static random access memory (SRAM) cells formed in a semiconductor substrate, first deep trenches isolating each boundary between an n-well and a p-well of the SRAM cells, second deep trenches isolating the SRAM cells into each unit bit cell, and at least one or more contacts taking substance voltage potentials in regions isolated by the first and second deep trenches.

According to an embodiment of the present invention, there is provided a manufacturing method of a semiconductor device, comprising forming first deep trenches isolating each boundary between an n-well and a p-well of the SRAM cells, forming second deep trenches isolating the SRAM cells into each unit bit cell, forming at least one or more contacts taking substrate voltage potentials, and forming trench capacitors of DRAM cells at the same time of forming the first and/or second deep trenches.

BRIEF DESCRIPTION OF DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE EMBODIMENTS

Hereinafter, embodiments of the present invention will be described with reference to the drawings.

Figure 1:
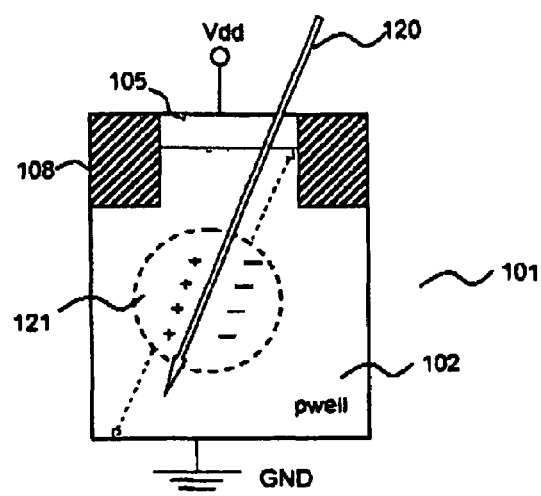
FIG. 1 shows influence of a rays on a semiconductor element.
Figure 2:
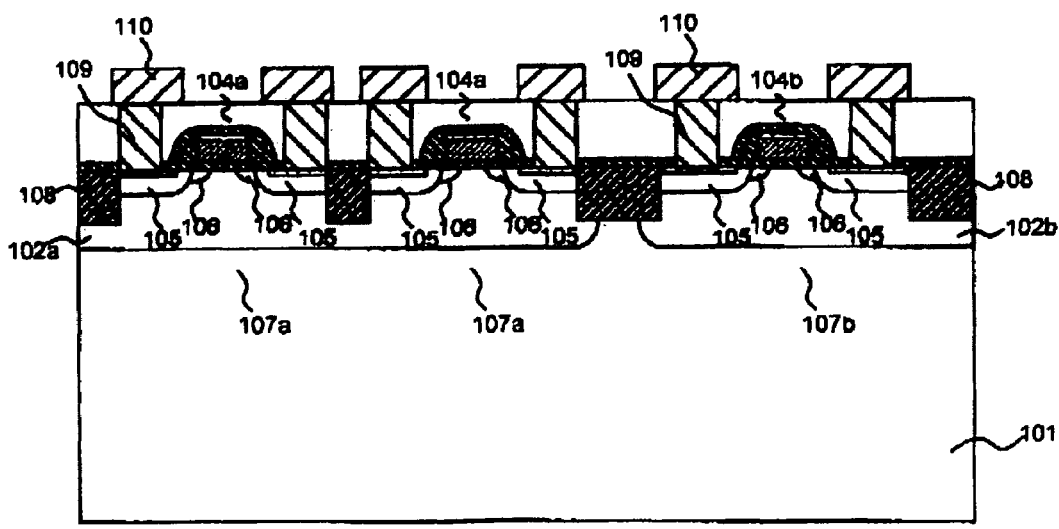
FIG. 2 shows an exemplary cross-sectional view of a conventional SRAM cell.
Figure 3:
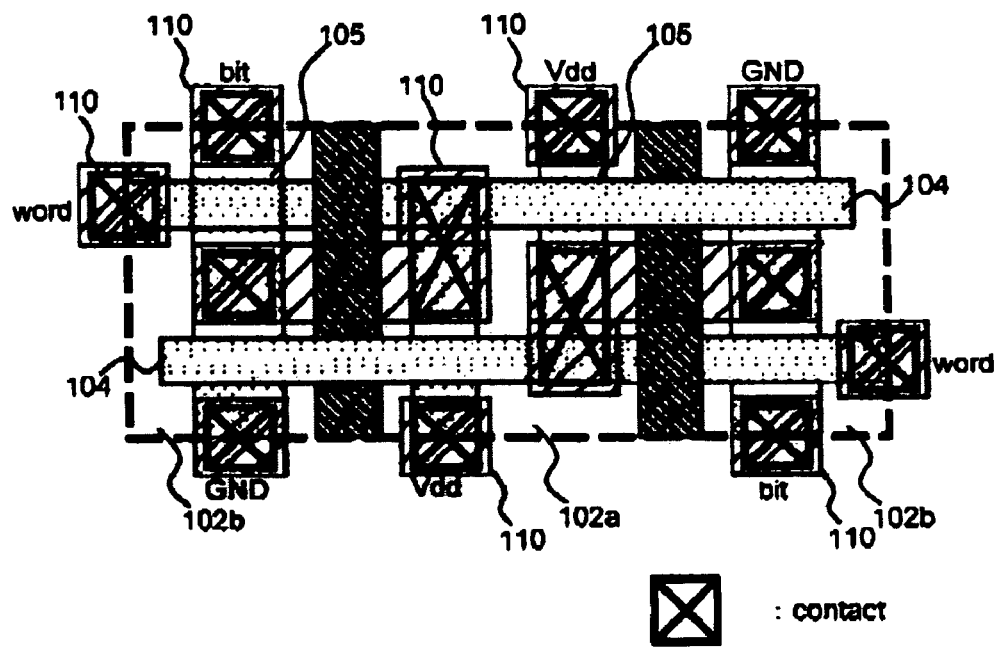
FIG. 3 shows an exemplary top view of the conventional SRAM cell.
Figure 4:
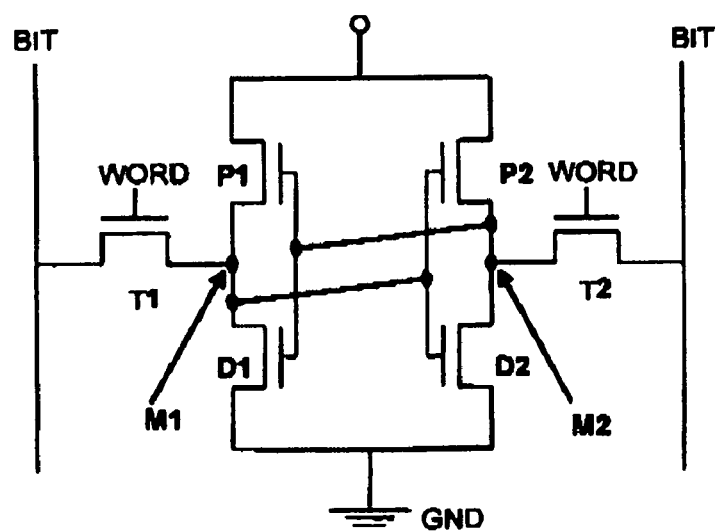
FIG. 4 shows an exemplary circuit diagram of an SRAM cell.
Figure 5:
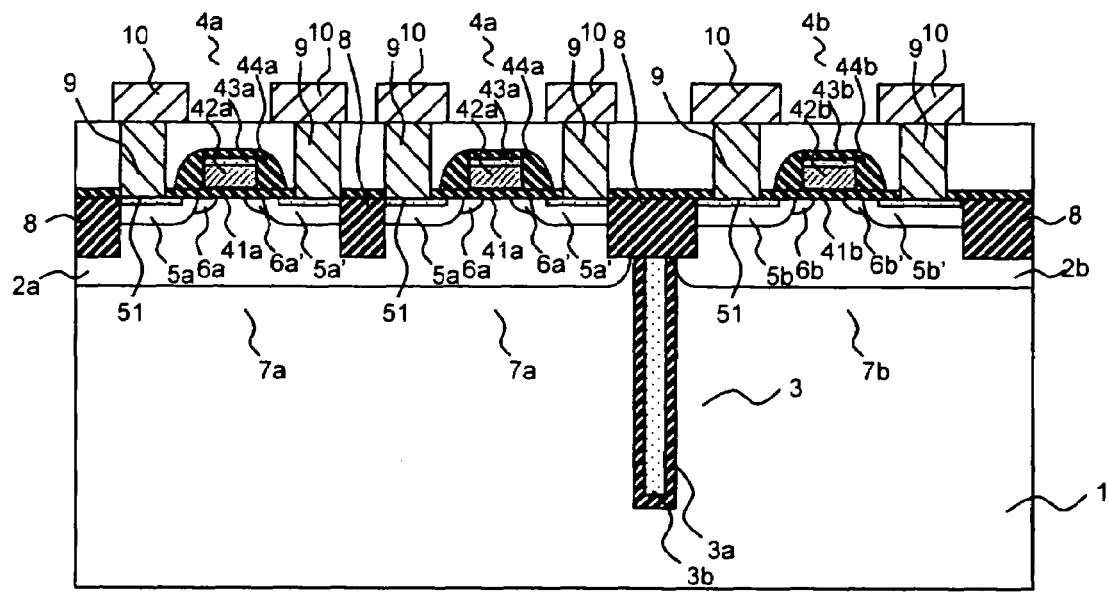
FIG. 5 shows an exemplary cress-sectional view of an SRAM cell relating to an embodiment of the present invention.

FIG. 5 shows a cross-sectional view of an SRAM cell in a semiconductor device relating to an embodiment of the present invention. An N-well 2a and a P-well 2b formed in a p-semiconductor substrate 1 are, as shown in FIG. 5, isolated by a deep trench 3. In the deep trench 3 (for example, with depth of 7-10 μm), a $SiO_2$ film 3a is formed on a side wall and a bottom of the deep trench 3, and a polysilicon film 3b is formed inside the $SiO_2$ film 3a.

Gate electrodes 4a and 4b composed of, for instance, polysilicon layers 42a and 42b and silicide layers (for instance, NiSi layer) 43a and 43b are formed on the N-well 2a and P-well 2b through gate dielectric films 41a and 41b composed of, for instance, $SiO_2$, respectively. Dielectric films 44a and 44b are formed on the surfaces and side walls of the Gate electrodes 4a and 4b, respectively. A p-channel MOSFET 7a and an N-channel MOSFET 7b are constituted together with deep diffusion layers 5a, 5a', 5b and 5b' (for example, with depths of about 0.1-0.2 μm) and shallow diffusion layers 6a, 6a', 6b and 6b' (for example, with depths of not more than about 0.1 μm) formed so as to sandwich directly under part of the gate electrodes 4a and 4b, respectively. Element isolating dielectric films 8 isolate the P-channel MOSFET and the N-channel MOSFET, and contacts 9 connect these parts to metal wirings 10 through each silicide layer (for example, NiSi layer) 51 on the surfaces of the diffusion layers 5a, 5a' 5b and 5b', respectively.

Figure 6:
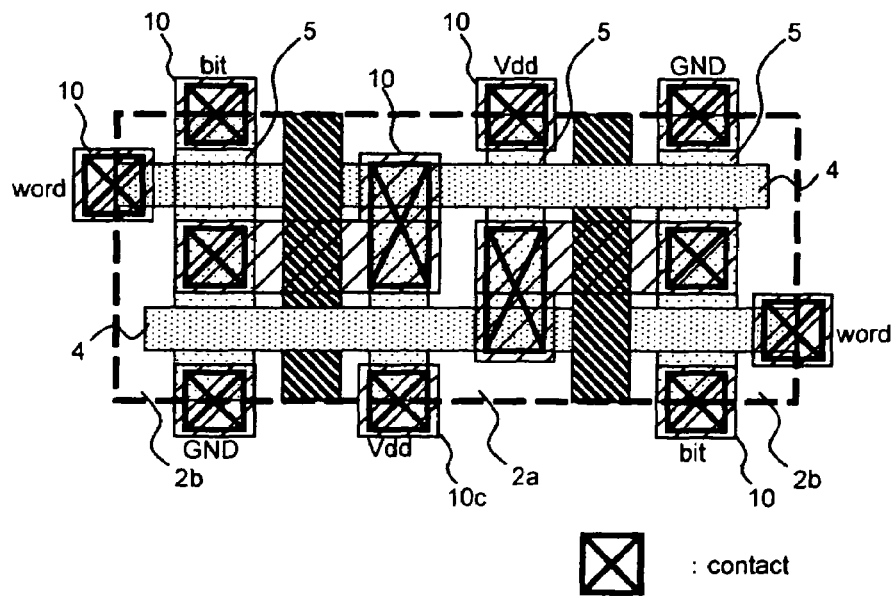
FIG. 6 shows an exemplary top view of a unit bit cell of the SRAM cell relating to an embodiment of the present invention.

FIG. 6 shows a top view of the unit bit cell of the SRAM cell. As shown in FIG. 6, like a conventional one, each diffusion layer 5 formed on the N-well 2a and P-well 2b is connected to metal wirings 10, such as word lines, bit lines and a Vdds through the contacts 9, respectively.

Figure 7:
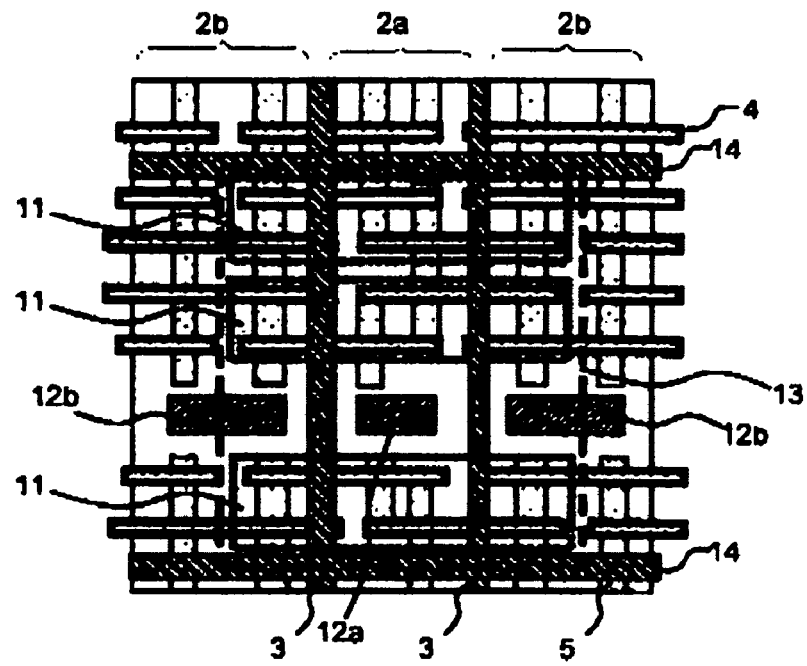
FIG. 7 shows an exemplary top view of the SRAM cell relating to an embodiment of the present invention.

Then, like the top view of the SRAM cell shown in FIG. 7, substrate contacts (N-contact 12a, P-contact 12b) taking substrate electric potentials are each disposed between bit cells 11 constituted by alternately combining the p-channel MOSFET and the N-channel MOSFET. Further, three bit cells 11 are set to a unit bit cell 13, and each unit bit cell 13 is isolated by deep trenches 14.

Such semiconductor device is formed as follows. The deep trenches 3 are firstly formed in the p-semiconductor substrate 1, then the $SiO_2$ film 3a is formed on the side wall and bottom of deep trench 3, and furthermore, the polysilicon film 3b is formed thereinside. Next to this, after forming the N-well 2a and P-well 2b by injecting impurities, shallow trenches are formed and plugged with a dielectric film, and then, the element isolating dielectric film 8 is formed. Then, the polysilicon layer and silicide layer (for instance, NiSi layer) are formed and the gate electrodes 4a and 4b are formed by patterning in a usual method, the shallow diffusion layers 6a, 6a', 6b and 6b' and the deep diffusion layers 5a, 5a', 5b and 5b' are formed by injecting impurities therein.

Further, in a self-aligning method, etc., the dielectric films 44a and 44b are formed on the surfaces and side walls of the gate electrodes 4a and 4b and dielectric film such as TEOS is formed on the whole surfaces. After forming the contact holes at the prescribed positions of the dielectric film, the contact holes are plugged with W, Mo, etc. to form the contacts 9 connecting the silicide layers of the surfaces of the deep diffusion layers 5a, 5a', 5b and 5b', respectively. Moreover, the metal wirings 10 such as word lines, bit lines and Vdds are formed at the prescribed positions in their upper layers.

As mentioned above, the well isolating boundary and the unit bit cell boundary of the SRAM cell are isolated to sufficient deep regions by the deep trenches 3 and 14 not by the shallow trenches like conventional ones. Conventionally, electric charges, which are generated in the unit bit cell by for instance, incidence of a rays with high energy flow into the diffusion layers of a plurality of SRAM cells closed to one another to cause a destructive phenomenon of information stored in a plurality of cells. However, according to such structure, the electric charges generated within the regions isolated by the deep trenches 3 and 14 having been absorbed in the closest diffusion layers to enable suppressing destructive phenomena of data within limited cells, it becomes possible to prevent the data stored in the adjacent cells from being destroyed.

With the deep trenches 3 and 14 disposed in the lower layer of the element isolating dielectric film 8, the bit cell may be isolated without increasing the element in size. Further, disposing correcting functions in circuit for each unit bit cell makes it possible, as a semiconductor device, to suppress a functional deterioration caused from the soft error.

Moreover, with the substrate contacts 12a and 12b disposing; it becomes possible to suppress a glitch such as latch-up due to a variation in substrate voltage potential. In this case, to achieve a latch-up resistance and miniaturization of the element, it is preferable to shorten distances among each bit cell (MOSFET) and each substrate contact as much as possible, for instance, not more than 10 μm of the 0.1 μm generation. It is necessary to form one or more substrate contacts for each unit bit cell; two or more thereof can be formed.

In the present embodiment, the unit bit cells isolated by the deep trenches 3 and 14 having been set as a pair of bit cells 11 sandwiching the substrates contacts 12a and 12b therebetween, it is not limited to one pair of them, and the unit bit cell may be one which includes plural pieces of bit cells therein. It is preferable for the unit bit cell to be smaller in number of pairs (for instance, one pair of bit cells) to suppress the functional deterioration due to the soft error. Depending on the size of the element, it is desirable for the interval between the deep trenches to suppress to, for example, not more than 10-20 μm of the 0.1 μm generation.

Figure 8:
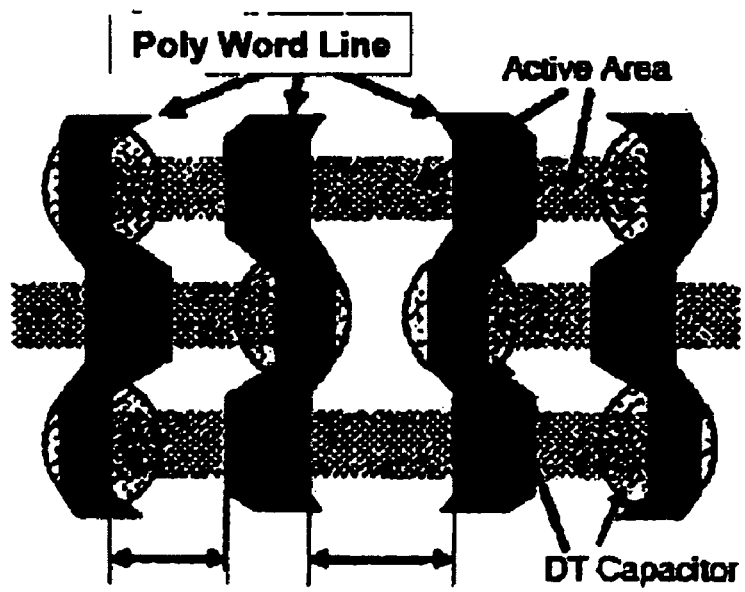
FIG. 8 shows an exemplary schematic top view of DRAM elements of a semiconductor device with DRAM mixedly mounted thereon relating to an embodiment of the present invention.

The deep trenches 3 and 14 are formed by usual etching processes, it is possible to use such as a method forming trench capacitors of DRAM. Accordingly, for a semiconductor device, such as an embedded DRAM system LSI, of which the top surface schematic view is shown in FIG. 8, on forming the trench capacitors of DRAM, similarly forming the deep trenches 3 and 14 in accordance with the same design rule as those of the trench capacitors of DRAM allows forming the deep trenches without increasing the number of processes. Like this manner, with the deep trenches 3 and 14 forming in the same design rule as those of the trench capacitors of DRAM, it is possible to sufficiently suppress movements of electric charges generated in the unit bit cell to the outside of the bit cell.

In the present embodiment, forming the $SiO_2$ film and the polysilicon film in the deep trenches in the same way as that of the trench capacitor of DRAM, it is enough for a structure to enable suppressing the movements of the electric charges to the outside of the bit cell and it is not always have to form the polysilicon film thereinside.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device improving soft error resistance of bulk-static random access memory (SRAM) cells, comprising:
   SRAM cells formed in a bulk semiconductor substrate;
   a first deep trench isolating each boundary between an n-well and a p-well of the SRAM cells;
   a second deep trench isolating the SRAM cells into each unit bit cell constructing from a singular bit cell or multiple bit cells; and substrate contacts taking substrate voltage potentials in a region isolated by the first deep trench and the second deep trench, at least one of the substrate contacts provided in the region.

2. The semiconductor device according to claim 1, wherein the substrate contact is provided at a distance of not more than 10 μm from a singular bit cell or one of the multiple bit cells.

3. The semiconductor device according to claim 1, wherein the second deep trench is provided at 10-20 μm intervals.

4. The semiconductor device according to claim 1, further comprising a shallow trench on the first deep trench or the second deep trench.

5. The semiconductor device according to claim 1, wherein the first deep trench and the second deep trench comprise an $SiO_2$ film formed on a side wall and a bottom of the first deep trench and the second deep trench, and a polysilicon film formed inside the $SiO_2$ film.

* * * * *